(12) United States Patent
Lin et al.

(10) Patent No.: US 11,531,057 B2
(45) Date of Patent: Dec. 20, 2022

(54) THROUGH-SILICON VIA CRACK DETECTING APPARATUS, DETECTING METHOD, AND SEMICONDUCTOR DEVICE FABRICATION METHOD HAVING THE SAME

(71) Applicant: Changxin Memory Technologies, Inc., Anhui (CN)

(72) Inventors: You-Hsien Lin, Hefei (CN); Chih-Wei Chang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 56 days.

(21) Appl. No.: 17/108,201

(22) Filed: Dec. 1, 2020

(65) Prior Publication Data
US 2021/0088576 A1     Mar. 25, 2021

Related U.S. Application Data (63) Continuation of application No. PCT/CN2019/112533, filed on Oct. 22, 2019.

(30) Foreign Application Priority Data

Oct. 22, 2018   (CN) .......................... 201811230376.6
Oct. 22, 2018   (CN) .......................... 201821718798.3

(51) Int. Cl.
*G01R 31/28*       (2006.01)

(52) U.S. Cl.
CPC ..... *G01R 31/2806* (2013.01); *G01R 31/2879* (2013.01)

(58) Field of Classification Search
CPC ............... H01L 23/481; H01L 25/0657; H01L 2225/06541; H01L 21/76898; H01L 22/14;
(Continued)

(56) References Cited

U.S. PATENT DOCUMENTS

| 7,973,547 B2 * | 7/2011 | Nitsch ..................... H01L 22/12 324/754.25 |
| 8,159,254 B2 * | 4/2012 | Kaltalioglu ........ G01R 31/2858 438/18 |

(Continued)

FOREIGN PATENT DOCUMENTS

| CN | 102315183 A | 1/2012 |
| CN | 104517937 A | 4/2015 |

(Continued)

OTHER PUBLICATIONS

PCT International Search Report and the Written Opinion dated Feb. 5, 2020, issued in related International Application No. PCT/CN2019/112533 (7 pages).

*Primary Examiner* — Vinh P Nguyen
(74) *Attorney, Agent, or Firm* — Sheppard Mullin Richter & Hampton LLP (57) ABSTRACT

The present disclosure relates to a through-silicon via (TSV) crack detecting apparatus, a detecting method, and a fabricating method of the semiconductor device. The TSV crack detecting apparatus includes a test TSV, a conductive liner, a second dielectric liner, a first contact, and a second contact. The test TSV is disposed within a semiconductor substrate, including a conductive channel and a first dielectric liner for isolating the conductive channel and the semiconductor substrate. The conductive liner surrounds the first dielectric liner. The second dielectric liner surrounds the conductive liner. The first contact is connected to the conductive channel. The second contact is connected to the conductive liner. A voltage difference between the first contact and the second contact is used to determine whether a TSV within a predetermined range to the test TSV has a crack based on a conductive state between the first contact and the second contact.

13 Claims, 4 Drawing Sheets

(58) Field of Classification Search
CPC ....... H01L 2224/97; H01L 2225/06527; H01L 2225/06596; H01L 24/97; H01L 23/48; H01L 22/12; H01L 22/30; H01L 23/49827; H01L 2225/1052; H01L 24/16; G01R 31/2853; G01R 31/2851; G01R 31/2879; G01R 31/307; G01R 31/50; G01R 31/3187; G06F 11/2221; G06F 30/398

See application file for complete search history.

(56) References Cited

U.S. PATENT DOCUMENTS

| | | |
|---|---|---|
| 8,598,714 B2 | 12/2013 | Huisinga et al. |
| 8,754,704 B2 * | 6/2014 | Huang ................ H03K 17/687 |
| | | 327/565 |
| 8,803,308 B2 * | 8/2014 | Ishikawa ............ H01L 25/0657 |
| | | 257/777 |
| 9,869,713 B2 | 1/2018 | Lim et al. |
| 11,276,671 B2 * | 3/2022 | Chang .................. H01L 23/481 |
| 11,327,050 B2 * | 5/2022 | Yazzie ............... G01N 29/4445 |
| 2016/0163607 A1 | 6/2016 | Oh et al. |

FOREIGN PATENT DOCUMENTS

| | | |
|---|---|---|
| CN | 205861845 U | 1/2017 |
| CN | 107407702 A | 11/2017 |
| CN | 208835021 U | 5/2019 |

\* cited by examiner

THROUGH-SILICON VIA CRACK DETECTING APPARATUS, DETECTING METHOD, AND SEMICONDUCTOR DEVICE FABRICATION METHOD HAVING THE SAME

CROSS-REFERENCE TO RELATED APPLICATION

This application is a continuation application of International Patent Application No. PCT/CN2019/112533, filed on Oct. 22, 2019, which is based on and claims priority to and benefits of the Chinese Patent Application Nos. 201811230376.6 and 201821718798.3, both filed with the State Intellectual Property Office (SIPO) of the People's Republic of China on Oct. 22, 2018. The above-referenced applications are incorporated herein by reference in their entirety.

TECHNICAL FIELD

The present disclosure relates to the field of integrated circuit technology, and in particular, to a through-silicon via crack detecting apparatus, a detecting method, and a semiconductor device fabrication method thereof.

BACKGROUND

The three-dimensional (3D) integrated circuit (IC) chip is a new chip structure in which a plurality of dies are stacked in a vertical direction connected via the through-silicon via (TSV) vertical interconnection technique, wherein different circuits units are fabricated on the dies formed by slicing the wafers. The three-dimensional chip is widely used due to its high integration, low power consumption, high bandwidth, small area, short interconnection lines, and support for heterogeneous integration.

However, one or more thermal cycles are required in the downstream process of the three-dimensional chip fabrication. Since the coefficient of thermal expansion of the conductive material (e.g., copper) in the TSV is different from the coefficient of thermal expansion of the material (e.g., silicon) of surrounding dies, the conductive material in the TSV may cause cracks in the material of surrounding dies due to thermal expansion, which may affect the performance of the chip when the crack propagates to other circuit units on the wafer.

It is to be noted that the above information disclosed in this Background section is only for enhancement of understanding of the background of the invention and therefore may contain information that does not form the prior art that is already known to a person of ordinary skill in the art.

SUMMARY OF THE INVENTION

Embodiments of the present disclosure disclose a through-silicon via crack detecting apparatus, a detecting method, and a semiconductor device fabrication method having the same. The through-silicon via crack detecting apparatus can detect whether a through-silicon via on the semiconductor substrate is cracked, and adjust parameters of the cracked through-silicon via accordingly.

Other features and advantages of the present disclosure will be more obvious from the following detailed description or learned by practicing the present disclosure.

One aspect of the present disclosure is directed to a method for detecting a TSV crack. The detecting method may comprise: providing a plurality of TSVs and a TSV crack detecting apparatus on a semiconductor substrate; and detecting whether a test TSV in the TSV crack detecting apparatus has a crack so as to determine whether the plurality of TSVs within a predetermined distance to the test TSV has a crack in accordance with the detection. The TSV crack detecting apparatus may comprise: the test TSV disposed within the semiconductor substrate, wherein the test TSV comprises a conductive channel and a first dielectric liner for isolating the conductive channel and the semiconductor substrate; a conductive liner disposed within the semiconductor substrate and surrounding the first dielectric liner; a second dielectric liner disposed within the semiconductor substrate and surrounding the conductive liner; a first contact disposed on the semiconductor substrate and electrically connected to the conductive channel; and a second contact disposed on the semiconductor substrate and electrically connected to the conductive liner.

In an embodiment of the present disclosure, detecting whether a test TSV in the TSV crack detecting apparatus has a crack may comprise: measuring a voltage difference between the first contact and the second contact; and determining that the test TSV has a crack if the first contact is detected to be in conduction with the second contact, or determining that the test TSV has no crack if the first contact is detected not to be in conduction with the second contact.

In an embodiment of the present disclosure, determining whether the plurality of TSVs within a predetermined distance to the test TSV has a crack may comprise: determining that one of the plurality of TSVs within a predetermined distance to the test TSV has a crack if the test TSV is detected to have a crack; or determining that the plurality of TSVs within a predetermined distance to the test TSV has no crack when the test TSV is detected to have no crack.

In an embodiment of the present disclosure, the semiconductor substrate may comprise a wafer having scribe lines for dicing, and a plurality of test TSVs are arranged on the scribe lines.

In an embodiment of the present disclosure, the plurality of test TSVs may be spaced apart from each other in an equal distance on the scribe lines.

In an embodiment of the present disclosure, the plurality of test TSVs may be removed from the semiconductor substrate during dicing.

In an embodiment of the present disclosure, the plurality of test TSVs may be arranged outside a chip region of the wafer, and the plurality of TSVs may be arranged within the chip region of the wafer.

In an embodiment of the present disclosure, process parameters of the plurality of TSVs and process parameters of the test TSV may be the same.

In an embodiment of the present disclosure, the process parameters may comprise a chemical mechanical polishing uniformity, parameters of a Backside Via Reveal process, or a combination thereof.

Another aspect of the present disclosure is directed to a method for fabricating a semiconductor device. The fabricating method may comprise: determining positions of a plurality of cracked TSVs on a first semiconductor substrate, wherein the plurality of cracked TSVs is detected using the above method for detecting a TSV crack; and process parameters corresponding to the plurality of cracked TSV.

In an embodiment of the present disclosure, the adjusted process parameters may be applied to a plurality of TSVs on a second semiconductor substrate at the determined positions.

In an embodiment of the present disclosure, a yield of TSVs of the second semiconductor substrate may be greater than a yield of TSVs of the first semiconductor substrate.

One aspect of the present disclosure is directed to a through-silicon via (TSV) crack detecting apparatus. The TSV crack detecting apparatus may comprise a test TSV, a conductive liner, a second dielectric liner, a first contact, and a second contact. A test TSV is disposed within a semiconductor substrate, wherein the test TSV comprises a conductive channel and a first dielectric liner for isolating the conductive channel and the semiconductor substrate. A conductive liner is disposed within the semiconductor substrate and surrounds the first dielectric liner. A second dielectric liner is disposed within the semiconductor substrate and surrounds the conductive liner. A first contact is disposed on the semiconductor substrate and electrically connected to the conductive channel, and a second contact is disposed on the semiconductor substrate and electrically connected to the conductive liner. The TSV crack detecting unit is configured to determine, upon an application of a voltages to one of the first contact and the second contact, and measurement of the voltage of the other one of the first contact and the second contact, whether a TSV within a predetermined distance to the test TSV has a crack based on a conductive state between the first contact and the second contact.

In an embodiment of the present disclosure, a material of the conductive channel may comprise one or more of copper, tungsten, and aluminum.

In an embodiment of the present disclosure, a material of the conductive liner may comprise doped polysilicon.

In an embodiment of the present disclosure, the semiconductor substrate may comprise a keep-out-zone surrounding the test TSV, and wherein the conductive liner and the second dielectric liner are disposed within the keep-out-zone.

In an embodiment of the present disclosure, the semiconductor substrate may comprise a wafer having scribe lines for dicing, and a plurality of test TSVs are arranged on the scribe lines.

In an embodiment of the present disclosure, the plurality of test TSVs may be spaced apart from each other in an equal distance on the scribe lines.

Another aspect of the present disclosure is directed to a semiconductor device fabricated by using the fabricating method described above.

The present disclosure provides a through-silicon via crack detecting apparatus, a detecting method, and a semiconductor device fabrication method. The TSV detecting apparatus is configured to determine whether the test TSV has a crack based on a conductive state between the first contact and the second contact connected to the test TSV, thereby determining whether a TSV within a predetermined distance to the test TSV has a crack. In one aspect, the present disclosure can detect whether the TSV in the chip has a crack. And in another aspect, the present disclosure can detect the position where a crack occurs on the semiconductor substrate by the TSV crack detecting unit so as to adjust the parameter for the TSV in which the crack occurs.

It is to be understood that both the foregoing general description and the following detailed description are exemplary and explanatory only and shall not restrict the present disclosure.

BRIEF DESCRIPTION OF THE DRAWINGS

The accompanying drawings, which are incorporated in and constitute a part of the description, illustrate embodiments of the present disclosure and, together with the description, explain the principles of the present disclosure. It is apparent that these drawings present only some embodiments of the present disclosure, and those of ordinary skill in the art may obtain drawings of other embodiments from the accompanying drawings without any creative effort.

DETAILED DESCRIPTION

Exemplary embodiments will now be described more fully with reference to the accompanying drawings. However, these exemplary embodiments can be implemented in many forms and should not be construed as limitations to those set forth herein. Rather, these embodiments are presented to provide a full and thorough understanding of the present invention and to fully convey the concepts of the exemplary embodiments to others skilled in the art. Throughout the figures, similar reference numerals indicate identical or similar elements, so any duplicate description of them will be omitted.

Although relative terms such as "upper" and "lower" may be used herein to describe a spatial relationship of one component to another shown in the figures, they are used merely for the purpose of easy description based on, for example, the exemplary orientation depicted in the figures. It is to be understood that if the illustrated device is turned upside down, then the component described as being "upper" will now be a "lower" component. Other relative terms such as "high", "top", "bottom", "high", "left", and "right" have similar meanings. When a certain structure is described as being "on" another structure, it is possible that the specific structure is either integrally formed on the other structure or disposed thereon "directly" or "indirectly" via an intermediate structure.

As used herein, the terms "a", "an", and "the" are intended to mean that there are one or more elements/components/etc. As used herein, the terms "comprising", "including", and "having" are intended to be used in an open-ended sense to mean that there are possibly other element(s)/component(s)/etc. apart from the listed element(s)/component(s)/etc.

Figure 1:
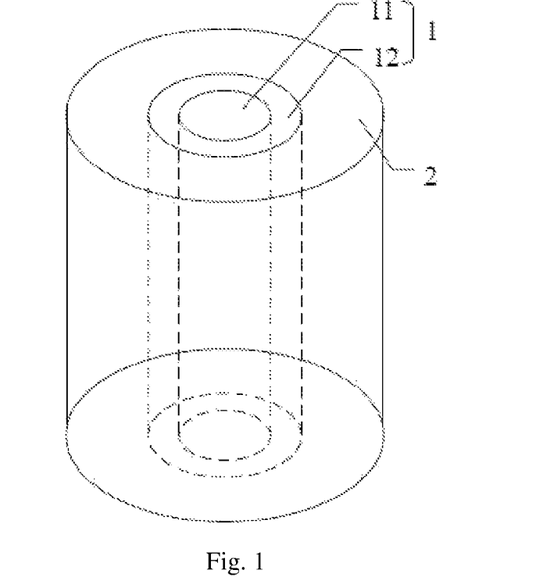
FIG. 1 is a schematic diagram of a structure of a TSV in the related art.
Figure 2:
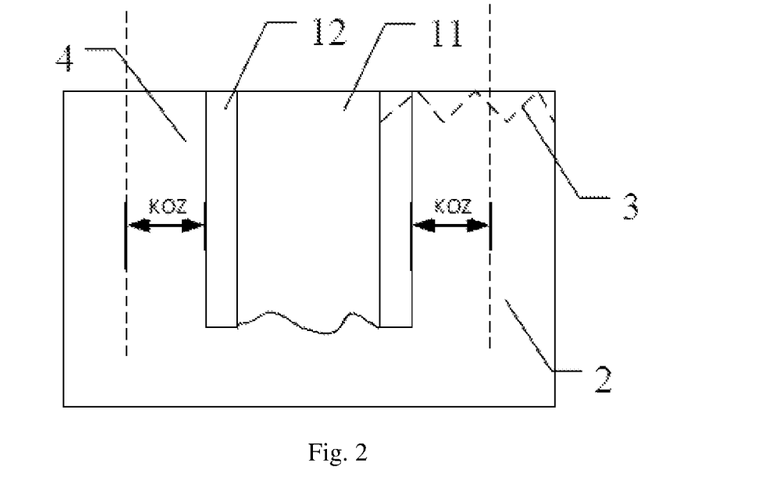
FIG. 2 is an axial sectional view of a TSV in the related art.

As shown in FIGS. 1-2, FIG. 1 is a schematic diagram of a structure of a TSV in the related art, and FIG. 2 is an axial sectional view of a TSV in the related art. In the related art, a through-silicon via (TSV) 1 is disposed within a semiconductor substrate 2. The TSV 1 may comprise a conductive channel 11 and a first dielectric liner 12 for isolating the conductive channel 11 and the semiconductor substrate 2. At least one thermal cycle is required in the downstream process of the three-dimensional chip fabrication process. Since the coefficient of thermal expansion of the conductive material in the conductive channel 11 is different from the coefficient of thermal expansion of the material of semiconductor substrate 2, the conductive material in the TSV may cause cracks 3 in the material of surrounding semiconductor substrate 2 due to thermal expansion, as shown in FIG. 2. When the cracks propagate to other circuit units on the wafer, they may affect the performance of the chip. In the related art, a keep-out-zone (KOZ) 4 is usually disposed in the periphery of the TSV 1. The keep-out-zone 4 may not include any circuit structures and may be used for buffering the thermal expansion of the conductive material. The keep-out-zone 4 may also prevent the TSVs from affecting each other. However, as shown in FIG. 2, if cracks 3 propagate beyond the keep-out-zone 4, other circuit structures may still be affected. Although enlarging the keep-out-zone 4 can avoid this problem, in the design process, it is still necessary to concern the area of the chip. If the crack condition of the TSV can be detected in advance, the yield of the TSV can be detected, and the data basis can be provided for parameters used for design of the TSV.

Figure 3:
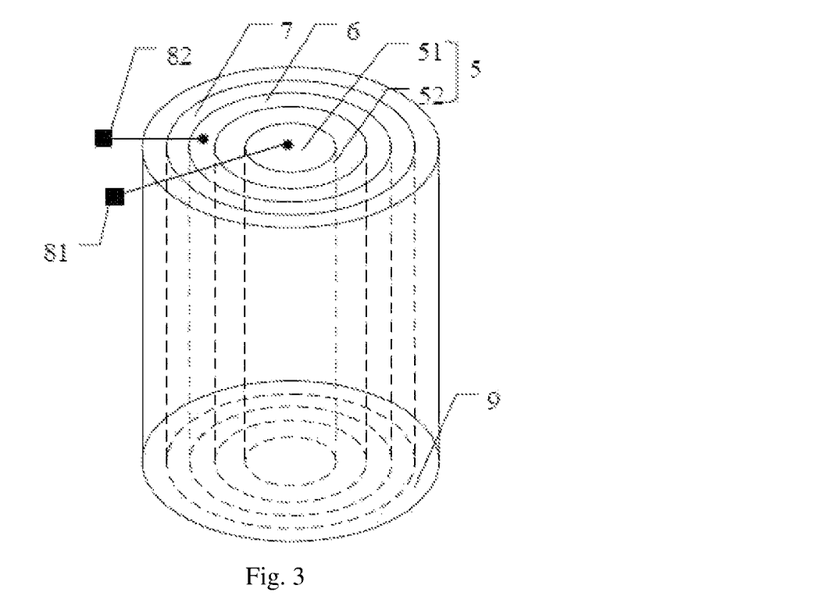
FIG. 3 is a schematic diagram of a structure of a TSV crack detecting apparatus according to one embodiment of the present disclosure.
Figure 4:
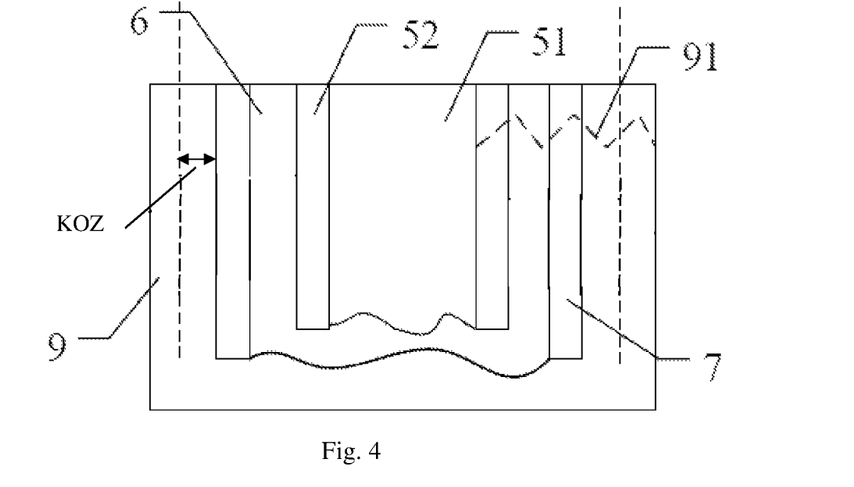
FIG. 4 is an axial sectional view of a TSV crack detecting apparatus according to one embodiment of the present disclosure.

Based on this, the embodiments of the present disclosure may provide a TSV crack detecting apparatus. As shown in FIGS. 3-4, FIG. 3 is a schematic diagram of a structure of a TSV crack detecting apparatus according to one embodiment of the present disclosure, and FIG. 4 is an axial sectional view of a TSV crack detecting apparatus according to one embodiment of the present disclosure. The TSV detecting apparatus may comprise a test TSV 5, a conductive liner 6, a second dielectric liner 7, a first contact 81, and a second contact 82. The test TSV 5 is disposed within a semiconductor substrate 9, wherein the test TSV 5 comprises a conductive channel 51 and a first dielectric liner 52 for isolating the conductive channel 51 and the semiconductor substrate 9. The conductive liner 6 surrounds the first dielectric liner 52. The second dielectric liner 7 surrounds the conductive liner 6. A first contact 81 is connected with the conductive channel 51. A second contact 82 is connected with the conductive liner 6. A voltage difference between the first contact 81 and the second contact 82 is used to detect a conductive state between the first contact 81 and the second contact 82 to determine whether a TSV within a predetermined distance to the test TSV 5 has a crack. If the first contact 81 is in conduction with the second contact 82, it is determined that there is a crack. Otherwise, there is no crack. The TSV within a predetermined distance to the test TSV 5 may be a TSV near the test TSV 5, for example, a TSV disposed adjacent to the test TSV 5. The semiconductor substrate 9 can be a substrate used in an integrated circuit structure and a TSV, such as wafers, dies, and the like.

The embodiments of the present disclosure provide a TSV crack detecting apparatus. The TSV crack detecting apparatus is configured to determine whether the test TSV 5 has a crack base on a conductive state between the first contact 81 and the second contact 82 of the test TSV 5, thereby determining whether a TSV within a predetermined distance to the test TSV 5 has a crack. In one aspect, the present disclosure can detect whether the TSV in the chip has a crack. In another aspect, the present disclosure can detect the position where a crack occurs on the semiconductor substrate 9 by the TSV crack detecting apparatus to adjust the parameters of the cracked TSV.

In one embodiment of the present disclosure, the semiconductor substrate 9 may comprise a KOZ surrounding the test TSV 5. The conductive liner 6 and the second dielectric liner 7 are surrounded by the KOZ. The KOZ surrounds the conductive liner 6 and the second dielectric liner 7, and no circuit structures are included.

In the embodiments of the present disclosure, a voltage difference between the first contact 81 and the second contact 82 may be provided by a tester, and a conductive state between the first contact 81 and the second contact 82 may be tested by the tester. As shown in FIG. 4, when the semiconductor substrate 9 has a crack 91, the first dielectric liner 52 and the conductive liner 6 may be contacted, thereby causing the first contact 81 being in conduction with the second contact 82. Therefore, when the tester detects that the first contact 81 is in conduction with the second contact 82, it indicates that the test TSV 5 is cracked, such that a crack of the TSV within a predetermined distance to the test TSV 5 can be determined. Regardless of deep cracks or surface cracks, the conduction can be detected. Therefore, the TSV crack detecting apparatus can detect not only the cracks in the surface of the TSV but also the cracks deep in the TSV. When the tester detects that the first contact 81 is not in conduction with the second contact 82, it indicates that the test TSV 5 has no cracks, such that no cracks in the TSV within a predetermined distance to the test TSV 5 can be determined. The process parameters of the test TSV 5 can be the same as the process parameters of the TSV, thereby improving the accuracy of the detection. The first contact 81 and the second contact 82 may be disposed on the semiconductor substrate 9 and have conductive nodes with a certain contact area to facilitate contact with the probes of the tester.

In one embodiment of the present disclosure, in order to enable that the conductive channel 51 contacts the conductive liner 6 during a thermal expansion, the coefficient of thermal expansion of the conductive liner 6 may be smaller than the coefficient of thermal expansion of the conductive channel 51, thereby preventing no contact between the conductive channel 51 and the conductive liner 6 during simultaneously thermally expansions thereof. The material of the conductive channel 51 may include one or more of copper, tungsten, and aluminum. The material of the conductive liner 6 may include doped polysilicon. It should be understood that in other embodiments of the present disclosure, the conductive channel 51 and the conductive liner 6 may comprise other materials, and all of which are protected within the scope of the present disclosure.

Figure 5:
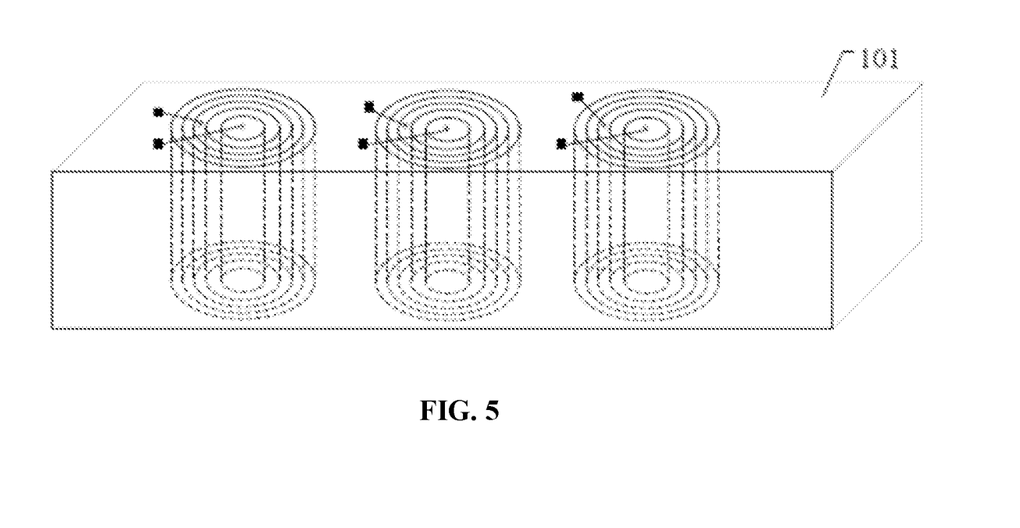
FIG. 5 is a schematic diagram of a structure of a TSV crack detecting apparatus according to one embodiment of the present disclosure.
Figure 6:
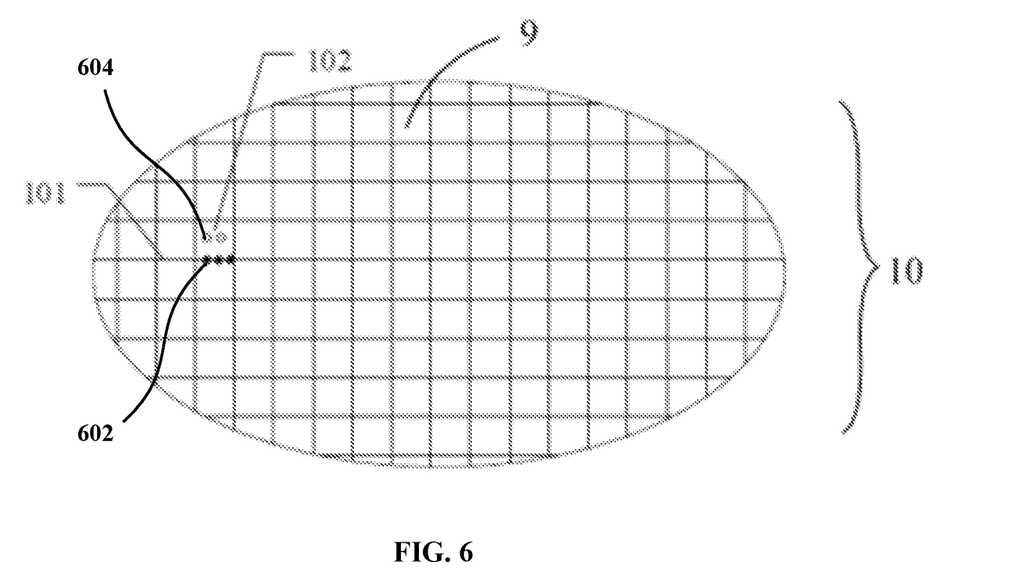
FIG. 6 is a top view of a portion of wafer where the TSV crack detecting apparatus located according to one embodiment of the present disclosure.

In the embodiments of the present disclosure, as shown in FIGS. 5-6, FIG. 5 is a schematic diagram of a structure of a TSV crack detecting apparatus according to one embodiment of the present disclosure, and FIG. 6 is a top view of a portion of wafer 10 where the TSV crack detecting apparatus located according to one embodiment of the present disclosure. There may be multiple, such as three, test TSVs 602, as illustrated in black dots in FIG. 6. Each of the test TSVs 602 has a conductive liner, a second dielectric liner, a first contact, and a second contact. The multiple test TSVs 602 may be spaced apart in an equal distance on the scribe lines 101 of the semiconductor substrate 9. The multiple test TSVs 602 can detect crack states of TSVs 604 (e.g., first TSVs) (illustrated as white dots in FIG. 6) in different position ranges, wherein the TSVs 604 can be disposed in the chip region 102 of the wafer 10. In addition, the test TSVs 602 disposed on the scribe lines 101 do not affect other circuits within the chip region 102 on the semiconductor substrate 9. When the semiconductor substrate 9 is diced into dies, the test TSVs 602 on the scribe lines can be cut off or removed.

Figure 7:
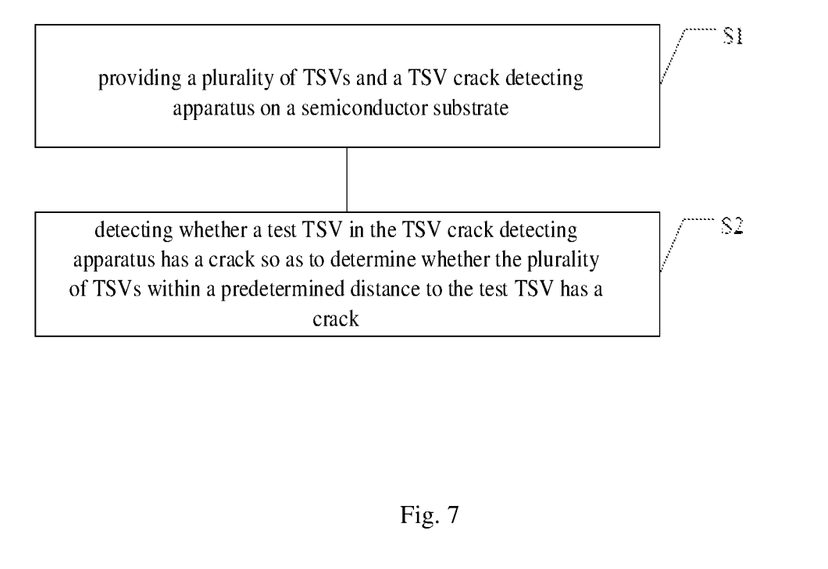
FIG. 7 is a flowchart of a method for detecting a TSV crack according to one embodiment of the present disclosure.

The embodiments of the present disclosure also provide a method for detecting a TSV crack. FIG. 7 illustrates a method for detecting a TSV crack according to one embodiment of the present disclosure. The method may comprise the following steps: step S1, providing a plurality of TSVs and a TSV crack detecting apparatus on a semiconductor substrate 9; and step S2, detecting whether a test TSV in the TSV crack detecting apparatus has a crack to determine whether the plurality of TSVs within a predetermined distance to the test TSV has cracks.

The TSV crack detecting method provided by the embodiments of the present disclosure can detect the crack state of the TSVs in the chip region of the semiconductor substrate by the above-described TSV crack detecting apparatus, thereby determining the yield of the TSVs on the semiconductor substrate.

In one embodiment of the present disclosure, a TSV may be formed in a chip region of a semiconductor substrate for connecting a plurality of chips. The test TSVs may be disposed on the scribe lines of the semiconductor substrate outside the chip region. The test TSV may be multiple, and each of the test TSVs may include a conductive liner, a second dielectric liner, a first contact, and a second contact. A plurality of the test TSVs may be spaced apart in an equal distance on the scribe lines of the semiconductor substrate. The plurality of test TSVs can determine crack states of the TSVs in different position ranges.

In one embodiment of the present disclosure, detecting whether the test TSV in the TSV crack detecting apparatus has a crack may comprise: measuring a voltage difference between the first contact and the second contact; and determining that the test TSV has a crack if the first contact is detected to be in conduction with the second contact, or determining that the test TSV has no crack if the first contact is detected not to be in conduction with the second contact.

In one embodiment of the present disclosure, determining whether the plurality of TSVs within a predetermined distance to the test TSV has a crack may comprises: determining that the plurality of TSVs within a predetermined distance to the test TSV may have cracks if the test TSV is determined to have a crack; or determining that the plurality of TSVs within a predetermined distance to the test TSV may have no cracks when the test TSV is determined to have no crack.

In one embodiment of the present disclosure, the semiconductor substrate may comprise a wafer having scribe lines for dicing, and a plurality of test TSVs are spaced apart in an equal distance on the scribe lines.

The TSV crack detecting method provided by the embodiments of the present disclosure may have the same technical features and working principles as described in the TSV crack detecting apparatus, details of the method are not repeated herein.

Figure 8:
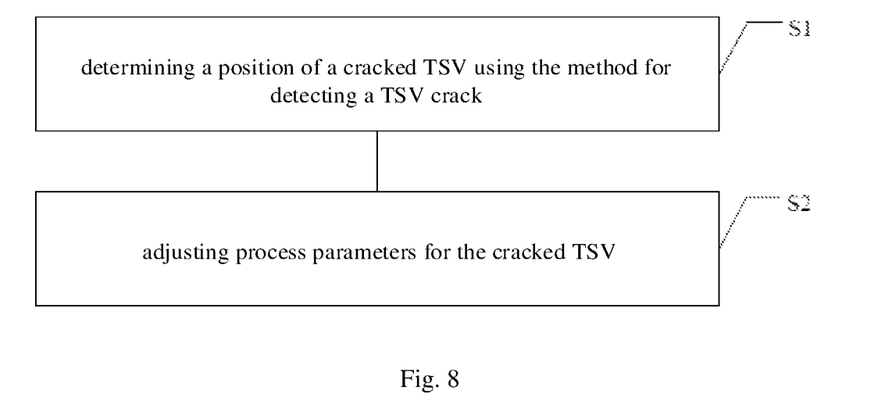
FIG. 8 is a flowchart of a method for fabricating semiconductor devices according to one embodiment of the present disclosure.

The embodiments of the present disclosure may further provide a method for fabricating a semiconductor device. FIG. 8 illustrates a flowchart of a method for fabricating the semiconductor device according to one embodiment of the present disclosure. The method may comprise the following step: step S1, determining a position of a cracked TSV using the TSV crack detecting method described above; and step S2, adjusting process parameters for the cracked TSVs. For example, the Backside Via Reveal (BVR) Process, chemical mechanical polishing (CMP) uniformity, and the like may be adjusted.

The semiconductor device fabrication method provided by the embodiments of the present disclosure may first determine the crack positions of the TSVs on the semiconductor substrate by the TSV crack detection method described above. When configuring TSVs on the next semiconductor substrate, process parameters may be adjusted for the TSVs located at the determined crack positions, thereby improving the yield of the TSVs.

The embodiments of the present disclosure may also provide a semiconductor device which is fabricated by the method for fabricating the semiconductor device described above. The semiconductor device can be a three-dimensional integrated circuit.

The semiconductor device may have the same technical features and working principles as the semiconductor device fabrication method described above, details of the device are not repeated herein.

Other embodiments of the present disclosure may be obvious to those skilled in the art from considering the specification and practicing the invention disclosed herein. Accordingly, the present disclosure covers all and any variations, uses, or adaptations of the disclosure that follow the general principles thereof and include common knowledge or conventional techniques of the art that are not described in the present disclosure. The specification and embodiments are merely exemplary. The true scope and spirit of the present disclosure may be indicated by claims.

It should be understood that the present disclosure is not limited to the precise structures that have been described above and illustrated in the drawings. Various modifications and changes can be made without departing from the scope thereof. The scope of the present disclosure is limited only by the appended claims.

What is claimed is:

1. A method for detecting a through-silicon-via (TSV) crack, comprising:
    providing a first TSV and a TSV crack detecting apparatus on a semiconductor substrate, wherein the TSV crack detecting apparatus comprises:
        a test TSV disposed adjacent to and within a predetermined distance to the first TSV, wherein the test TSV comprises:
            a conductive channel and a first dielectric liner surrounding the conductive channel, the conductive channel and the first dielectric liner being disposed within the semiconductor substrate;
            a conductive liner disposed within the semiconductor substrate and surrounding the first dielectric liner;
            a second dielectric liner disposed within the semiconductor substrate and surrounding the conductive liner;
            a first contact disposed on the semiconductor substrate and electrically connected to the conductive channel; and
            a second contact disposed on the semiconductor substrate and electrically connected to the conductive liner;
    determining a voltage difference between the first contact and the second contact;
    determining, based on the voltage difference, whether the first contact is in conduction with the second contact;
    determining, in response to the first contact is in conduction with the second contact, that the test TSV in the TSV crack detecting apparatus has a crack, and that the first TSV has a crack; and
    determining, in response to the first contact is not in conduction with the second contact, that the test TSV in the TSV crack detecting apparatus has no crack, and that the first TSV has no crack.

2. The method for detecting a TSV crack of claim 1, further comprising a plurality of test TSVs including the test TSV, wherein the plurality of test TSVs is spaced apart from each other in an equal distance.

3. The method for detecting a TSV crack of claim 2, wherein the plurality of test TSVs are disposed on a scribe line of the semiconductor substrate.

4. The method for detecting a TSV crack of claim 2, further comprising a plurality of first TSVs including the first TSV, wherein the plurality of test TSVs is arranged outside a chip region of the semiconductor substrate, and the plurality of first TSVs is arranged within the chip region of the semiconductor substrate.

5. The method for detecting a TSV crack of claim 1, wherein process parameters of the first TSV and process parameters of the test TSV are the same.

6. The method for detecting a TSV crack of claim 5, wherein the process parameters comprise a chemical mechanical polishing uniformity, parameters of a Backside Via Reveal process, or a combination thereof.

7. A method for fabricating a semiconductor device, comprising:
   determining positions of a plurality of cracked TSVs, wherein the plurality of cracked TSVs is detected using the method for detecting a TSV crack of claim 1; and
   adjusting process parameters corresponding to the plurality of cracked TSV.

8. A through-silicon via (TSV) crack detecting apparatus, comprising:
   a test TSV disposed within a semiconductor substrate, wherein the test TSV comprises:
      a conductive channel and a first dielectric liner surrounding the conductive channel, the conductive channel and the first dielectric liner being disposed within the semiconductor substrate;
      a conductive liner disposed within the semiconductor substrate and surrounding the first dielectric liner;
      a second dielectric liner disposed within the semiconductor substrate and surrounding the conductive liner;
      a first contact disposed on the semiconductor substrate and electrically connected to the conductive channel; and
      a second contact disposed on the semiconductor substrate and electrically connected to the conductive liner,
   wherein a voltage difference is applied between the first contact and the second contact to determine a conductive state between the first contact and the second contact, and wherein
      in response to the conductive state between the first contact and the second contact being that the first contact is in conduction with the second contact, each of the test TSV and a first TSV disposed within a predetermined distance to the test TSV is determined having a crack, and
      in response to the conductive state between the first contact and the second contact being that the first contact is not in conduction with the second contact, each of the test TSV and the regular TSV is determined not having any crack.

9. The apparatus of claim 8, wherein a material of the conductive channel comprises one or more of copper, tungsten, and aluminum.

10. The apparatus of claim 9, wherein a material of the conductive liner comprises doped polysilicon.

11. The apparatus of claim 8, wherein the semiconductor substrate comprises a keep-out-zone surrounding the test TSV, and wherein the conductive liner and the second dielectric liner are disposed within the keep-out-zone.

12. The apparatus of claim 8, further comprising a plurality of test TSVs including the test TSV, wherein the plurality of test TSVs is spaced apart from each other in an equal distance on a scribe line on the semiconductor substrate.

13. The apparatus of claim 8, wherein a coefficient of thermal expansion of the conductive liner is smaller than a coefficient of thermal expansion of the conductive channel.

* * * * *